United States Patent

Bennett

[11] 3,967,196
[45] June 29, 1976

[54] METHOD AND APPARATUS FOR MEASURING THE VOID CONTENT OF A SOLID DIELECTRIC

[75] Inventor: Allan Igo Bennett, Export, Pa.

[73] Assignee: Westinghouse Electric Corporation, Pittsburgh, Pa.

[22] Filed: Oct. 17, 1974

[21] Appl. No.: 515,745

[52] U.S. Cl. ............................... 324/54; 324/60 C
[51] Int. Cl.² ................................... G01R 31/14
[58] Field of Search ............... 324/54, 60 R, 60 C

[56] References Cited
UNITED STATES PATENTS
3,235,792   2/1966   Revesz et al. ............... 324/60 R X FOREIGN PATENTS OR APPLICATIONS
951,482   3/1964   United Kingdom .............. 324/54

*Primary Examiner*—James B. Mullins
*Attorney, Agent, or Firm*—W. A. Elchik

[57] ABSTRACT

A circuit modification of a capacitance bridge is provided to measure void content of high voltage electrical insulation. A sample of the insulation under investigation is disposed as the capacitor dielectric in one leg of a capacitance bridge. Signals proportional to the input and output of the capacitance bridge are fed to an oscillograph for display which is shaped like a parallelogram. In the disclosed invention a simple adjustment converts the parallelogram to a rectangle and the amount of adjustment required is read as a number from which the void content can be directly calculated.

10 Claims, 7 Drawing Figures

METHOD AND APPARATUS FOR MEASURING THE VOID CONTENT OF A SOLID DIELECTRIC

BACKGROUND OF THE INVENTION

1. Field of the Invention

This invention relates to a capacitance bridge system and more particularly to the use of a capacitive bridge and related cicuitry for measuring the void content of a solid dielectric.

2. Description of the Prior Art

High voltage electrical insulation, as used for example, in motors, generators, or cast resin bushings, usually contain some voids. These voids may arise for instance, as a result of imperfect filling of spaces between mica flakes or splitting by the impregnating resin, or from bubbles in cast resins. When the solid insulation is later subjected to high voltage alternating electrical stress, gas discharges, commonly called partial discharges or corona, will occur in the residual gas in these voids, eroding the surrounding resins and ultimately causing insulation failure. For this reason, measurement of void content is a well recognized tool for evaluating insulation quality.

The measurement of void content can be effected electrically by making the insulation the dielectric of a capacitor whose capacitance is measured at low voltages, insufficient to cause void ionization, and also at high voltages where the voids are ionized and act in effect like short circuits. The measurement of the low voltage capacitance and the high voltage capacitance provides a means for estimating the total void content. In an article entitled "A Capacitance Bridge Method For Measuring Integrated Corona-Charge Transfer and Power Loss Per Cycle" by T. W. Dakin and P. J. Malinaric, Paper 60–97, AIEE, 1960 Winter General Meeting, a method which utilizes a capacitance bridge and an oscillograph for estimating total void content is described in detail.

The most satisfactory method for measuring low voltage capacitance and the difference between the low voltage capacitances and the high voltage capacitances is a capacitance bridge. In operation, this capacitance bridge is balanced at a voltage low enough so that no void discharge occurs; and the output voltage is displayed as the vertical deflection on an oscillograph. The horizontal deflection on the oscillograph is proportional to the applied sinusoidal high voltage wave. When balanced at low voltage, the display will be a horizontal straight line. At applied voltages considerably higher than the point at which initial void ionization occurs, a parallelogram-shaped figure will be displayed on the oscillograph. The slope of the sides of this figure is proportional to the difference between the high voltage capacitance and the low voltage capacitance of the dielectric sample. In most practical insulation samples, many voids of different sizes and hence of different ionization voltages will be present, causing some curvature of the sides of the parallelogram at low voltages. That is, the sides of the parallelogram near the obtuse angles will be curved. In such case, measurements must be made at voltages high enough to give a relatively straight portion of the parallelogram sides, near voltage crests, to accurately portray the slope of this portion which is used for calculating the void fraction. It has been prior art practice to photograph the parallelogram display for each voltage of interest, and later make a measurement on the photograph to determine the slope of the parallelogram sides. The slope yields the difference between the high voltage capacitance and the low voltage capacitance from which the void content can be calculated. This prior art procedure has the disadvantages of costing time and film for the actual photograph and requiring time for later measurements on the photograph. In addition to these disadvantages, there is an undesirable time delay imposed and there is also the possibility of misidentifying, mislaying or misinterpreting the photographs showing the parallelogram.

SUMMARY OF THE INVENTION

A novel circuit is provided for use with a capacitance bridge and oscilloscope connection, which is conventionally used to measure void content in high voltage electrical insulation. The disclosed invention is provided to replace the present practice of photographing an oscillograph display, shaped like a parallelogram, and thereafter measuring slopes in the photograph to determine void content. A circuit having a simple adjustment which converts the parallelogram to a rectangle is provided. The amount of adjustment required is then read as a number from which the void content can be directly calculated, thus eliminating the time and cost of the photographs and reducing the probability of measurement error.

To eliminate the necessity of taking photographs, from which the slope of the parallelogram can be measured, the parallelogram is converted to a rectangle having a height and base identical to the original. This conversion is accomplished by a coordinate transformation which rotates the vertical, y-axis sufficient to increase the acute angle of the parallelogram to a right angle. The equations of such transformation are given by $y' = y$ and $x' = x - ky$ where $x'$ and $y'$ refer to the new axes and $x$ and $y$ refer to the old axes. $k$, the adjustment required to convert the parallelogram to a rectangle, is a measure of the amount of rotation. $k$ is in fact the reciprocal of the slope of the original parallelogram sides.

Electrically the transformation is obtained by subtracting from the horizontal oscillographic input voltage an adjustable fraction of the vertical input voltage. If the adjustable fraction, $k$, is derived from a linear variable potentiometer or voltage divider then $k$ is numerically the potentiometer reading when the transformation from the parallelogram to rectangle is made. Where some curvature of the parallelogram sides occurs because of a distribution of ionization voltage, the adjustment of $k$ is chosen to make vertical the straight portions of the sides. The desired capacitance difference $\delta$, which equals the dielectric high voltage capacitance minus the dielectric low voltage capacitance, is proportional to $1/k$. From the recorded value of $k$ and the values of the capacitance bridge elements, the insulation void fraction can be calculated without the necessity of photographs. The equation for this calculation is specifically:

$$f_v = C_3\, r\, S_v/(\epsilon\, C_s\, \alpha\, S_H\, k)$$

where $f_v$ is the fractional void content of the insulation sample; $C_3$ and $C_s$ are component values from the capacitance bridge; $r$ is the voltage divider ratio between the applied high voltage and the oscillograph horizontal input voltage; $S_V$ and $S_H$ are sensitivities (reciprocals of the gain) of amplifiers in the vertical and horizontal channels respectively; $\epsilon$ is the dielectric constant of the sample and α is the secondary to primary turns ratio of a transformer in the output of the capacitance bridge.

A circuit was built and tested embodying the principles of the present invention. Various examples and configurations of voids were tested utilizing this circuit. Artificial voids were constructed employing as samples sheets of polyethylene, clamped between electrodes, wherein the center sheets had various holes formed therein. The void fraction, $f_v$, thus measured on several such artificial voids agreed closely with the geometrically calculated values.

It is to be understood that in the specification and claims the x-axis and y-axis can be interchanged without affecting the teaching of the present invention. Oscillograph as used herein includes oscilloscope and any other suitable optical display device.

It is an object of this invention to provide a method and apparatus for determining the void content of a solid dielectric sample which does not require photographing the parallelogram, as provided for in the prior art, for indicating the high voltage and low voltage capacitance of the dielectric sample.

BRIEF DESCRIPTION OF THE DRAWINGS

For a better understanding of the invention, reference may be had to the preferred embodiment exemplary of the invention shown in the accompanying drawings, in which.

DESCRIPTION OF THE PREFERRED EMBODIMENT

Figure 1:
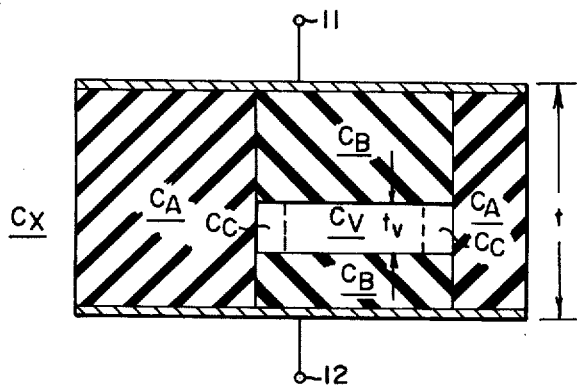
FIG. 1 is an illustration of an insulation sample model containing a void.
Figure 2:
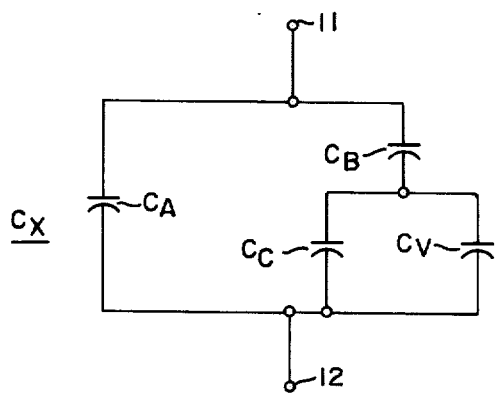
FIG. 2 is an electrical equivalent circuit of the insulation model shown in FIG. 1.

High voltage electrical insulation which is commonly used in electrical apparatus normally contains some voids. These voids which occur for a variety of reasons can have a deleterious effect on insulation subject to high electrical stress. When the insulation is subject to high alternating electrical stress, gas discharges will occur in the residual gas in the voids, eroding the surrounding resin and ultimately causing insulation failure. For these reasons, measurement of the void content of a solid dielectric is a well recognized tool for evaluating insulation quality. The measurement of void content can be effected electrically by making the insulation the dielectric of a capacitor whose capacitance is measured at a low voltage, insufficient to cause void ionization, and also at a high voltage, where the voids are ionized and act in effect like short circuits. FIG. 1 shows a model of insulation containing a single void and FIG. 2 is an approximate electrical equivalent circuit. At low voltages where the void capacitance $C_V$ is not ionized, the measured sample capacitance will be:

$$C_{XL} = C_A + \frac{C_B(C_V + C_C)}{C_B + C_V + C_C} \quad (1)$$

while at high voltages where the void is effectively short circuited by ionization, the incremental sample capacitance will be:

$$C_{XH} = C_A + C_B \quad (2)$$

wherein: $C_A$ represents the capacitance of the dielectric where the field lines do not intersect the void; $C_B$ represents the capacitance of the dielectric where the field lines do intersect the void; $C_C$ is caused by the edge effect around the void, and is negligible in a first approximation; $C_V$ is the capacitance of the void when not ionized; $C_{XL}$ is the capacitance of the dielectric sample with a low applied voltage; and $C_{XH}$ is the capacitance with a high applied voltage. The difference δ is equal to $$\delta = C_{XH} - C_{XL} = \frac{C_B^2}{C_C + C_V + C_B} \quad (3)$$

The difference δ depends on the void geometry. For a laminar void as shown in FIG. 1, parallel to the electrodes and of less area, with $C_C$ approximately equal to zero and the thickness of the void $t_V$ much less than the thickness of the dielectric sample $t$, we have:

$$\delta = C_B^2/C_V \quad (4)$$

$$C_{XL} \approx C_{XH} = C_A + C_B \quad (5)$$

then:

$$\frac{\delta}{C_{XL}} = \frac{C_B}{C_V} \cdot \frac{C_B}{C_A + C_B} = \epsilon \frac{t_V}{t} \cdot \frac{A_V}{A} = \epsilon \frac{t_V A_V}{t A} = \epsilon f_V \quad (6)$$

where: $f_V$ is the fractional void content of the insulation; $A_V$ is the void area of the sample parallel to the capacitor plate; $A$ is the area of the capacitor plate; $t$ is the thickness of the dielectric sample; $t_V$ is the thickness of the void; and $\epsilon$ is the insulation dielectric constant.

Figure 3:
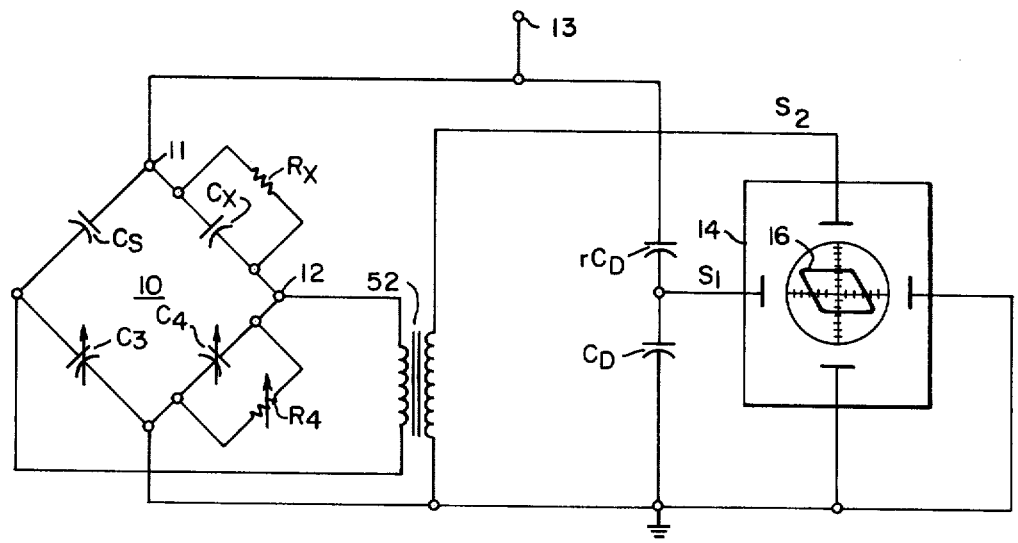
FIG. 3 is a prior art capacitance bridge circuit utilized for measuring the void content of a solid dielectric.
Figure 4:
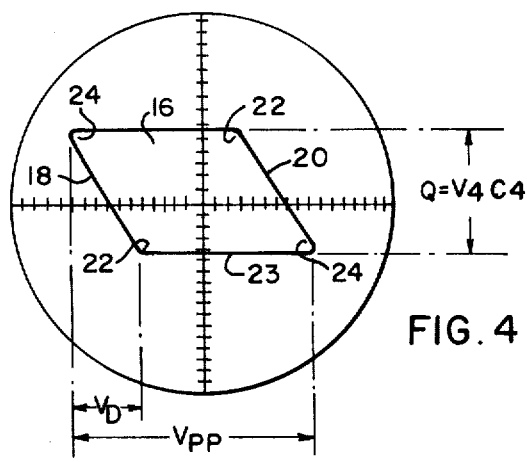
FIG. 4 shows a parallelogram display from a conventional capacitance bridge circuit connection as illustrated in FIG. 3.
Figure 6:
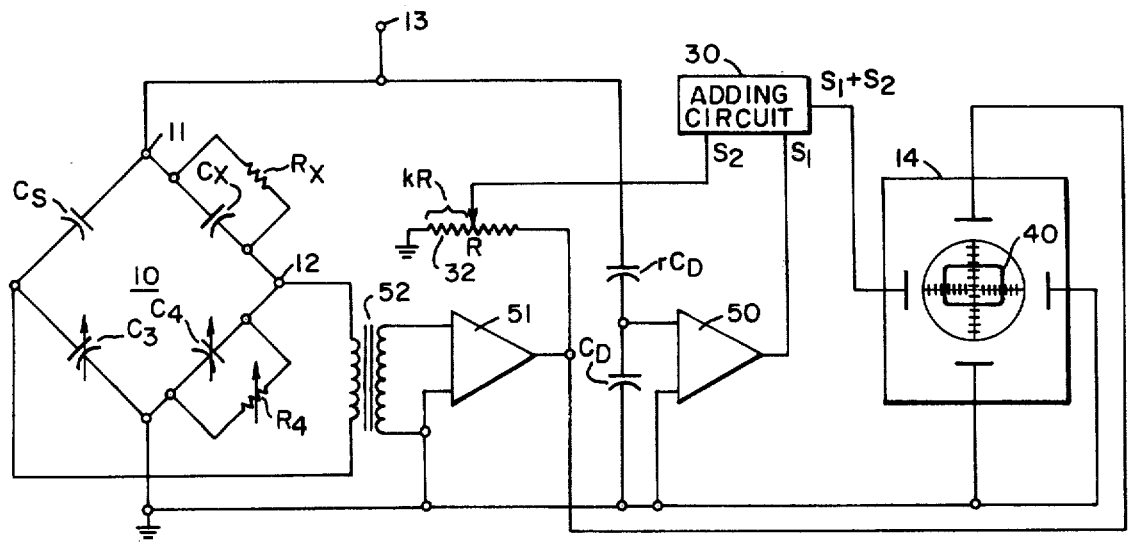
FIG. 6 shows a capacitive bridge and measuring circuit constructed according to the teaching of the present invention; and, FIG. 7 illustrates various void fractions determined by utilizing the teaching of the present invention in comparison with actual void fractions, determined geometrically, of constructed samples.

The most satisfactory means for measuring $C_{XL}$ and δ is the capacitance bridge 10, illustrated in FIGS. 3 and 6. The capacitance bridge 10 comprises four legs having values of $C_S$, $C_3$, $C_4$ and $R_4$, and $C_x$ and $R_x$. $R_x$ is the loss associated with capacitor $C_x$. $C_x$ is the capacitor having the insulation under investigation as a dielectric. In operation, the capacitance bridge 10 is balanced at a voltage low enough so that no void discharge occurs. The output of the bridge 10 is displayed as the vertical deflection on an oscillograph 14. The output of bridge 10 is connected to oscillograph 14 through transformer 52. The horizontal deflection of oscillograph 14 is proportional to the applied sinusoidal high voltage. During normal operation the voltage input is applied to terminal 13; capacitors $C_D$ and $rC_D$ act as a voltage divider to determine the proportion of the input voltage which is applied to the horizontal input of oscillograph 14. The sample under investigation is connected as the dielectric of capacitor $C_x$ between terminals 11 and 12. When balanced at low voltage, by adjusting $C_3$, $C_4$ and $R_4$, the oscillograph 14 display will be a horizontal straight line. At applied voltages considerably higher than that at which void ionization occurs, a parallelogram-shaped FIG. 16 will result on oscillograph 14. A graph of such a parallelogram 16 is shown in FIG. 4. The slope of the sides 18 and 20 of this parallelogram 16 are proportional to $\delta$.

In the article by Dakin and Malinaric, AIEE Paper 60–97 it is shown that the void fraction $f_V$ is given by:

$$f_V = \frac{C_{xH} - C_{xL}}{\epsilon C_{xL}} = \frac{Q}{\epsilon C_{xL} V_D}$$

where $Q$ is the total charge transferred each half cycle, observed at the sample terminals, as a result of void discharges; and $V_D$ is a fraction of the peak-to-peak applied voltage derived from the parallelogram, as shown in FIG. 4. (In the reference AIEE Paper 60–97, $C_{xH}$ is called $C_S$, and $C_{xL}$ is called $C_o$.) The charge $Q$, which also flows into $C_4$ which is in series with the sample, produces a voltage change $$V_4 = Q/C_4$$

across $C_4$; this voltage is responsible for the vertical deflection which forms the parallelogram.

In many practical insulation cases, many voids of different sizes and hence of different ionization voltages will be present, causing curvature of the sides 18 and 20 of parallelogram 16, near the obtuse angles 22, unless a sufficiently high voltage is applied. In such cases, measurements must be made at voltages high enough to give a relatively straight portion of the sides 18 and 20, near voltage crest. The slope of the sides 18 or 20 are used for calculating the void fraction, $f_V$. It has been the prior art practice to photograph the parallelogram display 16 for each voltage of interest and later to make a measurement on the photograph to determine the slope and thence $\delta$ and the void content. This process has disadvantages of requiring time and film for the actual photography and time for later measurements on the photographs. In addition there is a possibility of misidentifying, mislaying or misinterpreting these photographs of the parallelogram 16.

Figure 5:
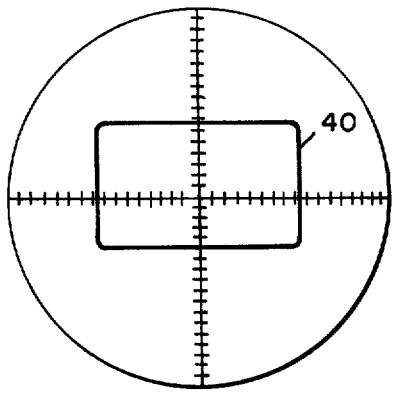
FIG. 5 shows a rectangular display from a capacitance bridge and associated circuitry constructed in accordance with the teaching of the present invention.

If the parallelogram 16 is considered as a figure in analytic geometry it can be converted to a rectangle of height and base identical to the original parallelogram 16 by a coordinate transformation. The coordinate transformation rotates the vertical Y-axis sufficiently to increase the acute angles 24 to a right angle. The equations of such a transformation are given by $y' = y$, $x' = x - ky$ where $x'$ and $y'$ refer to the new axis position and $x$ and $y$ refer to the old axis position. $k$ is a measurement of the amount of rotation. In fact, $k$ is just the reciprocal of the slope of the side 18 of the original parallelogram 16. As shown in FIG. 6, electrically such a transformation is attained by subtracting from the horizontal oscillograph input voltage $S_1$ an adjustable fraction $S_2$ of the vertical input voltage, from vertical amplifier 51. This can be accomplished through adding circuit 30. This fraction $k$, which is derived from a linear variable potentiometer or voltage divider 32, is numerically the potentiometer reading when the adjustment is made, so that the parallelogram 16 is made to have vertical sides yielding rectangle 40, as shown in FIGS. 5 and 6. That is, by adjusting potentiometer 32, the parallelogram 16, displayed on oscillograph 14, is converted to the rectangle 40 as shown in FIG. 5. Where the sides 18 and 20 curve, because of distribution of ionization voltages, adjustment of $k$ through potentiometer 32 is chosen to make vertical the straight portion of the sides 18 and 20. The desired capacitance difference $\delta$ which is equal to $C_{xH} - C_{xL}$ is now proportional to $1/k$ and from the recorded value of $k$ and the other values of the bridge elements the insulation void fraction can be immediately calculated with no need for photographs. The equation for this calculation is:

$$f_V = C_3 \, r \, S_V / (\epsilon \, C_S \, \alpha \, S_H \, k)$$

where $f_V$ is fractional void content of the insulation; $C_3$ and $C_S$ are bridge component values shown in FIGS. 3 and 6; $r$ is the voltage-divider ratio between the applied high voltage and the oscillograph 14 horizontal input voltage; $S_H$ and $S_V$ are sensitivities (reciprocals of the gain) of amplifiers 50 and 51 for the horizontal and vertical channels respectively; $\epsilon$ is the dielectric constant for the sample; and $\alpha$ is the secondary to primary turns ratio of transformer 52 providing the output of the capacitance bridge, 10.

Referring now to FIG. 6, the signal voltage, $S_1$, at the output of the horizontal amplifier 50 (whose gain is $1/S_H$) produced by $V_D$ is $V_D r/S_H$; the voltage $S_2$, from potentiometer 32, will be $V_4 \alpha \, 1/S_V \, k$.

$\alpha$ is the turns ratio of transformer 52. Since $k$ is adjusted to make these signals equal during the discharging parts of the cycle, we have $$\frac{V_D r}{S_H} = \frac{V_4 \alpha k}{S_V}, \text{ or } V_D = \frac{V_4 \alpha \, k \, S_H}{r \, S_V}.$$

Substituting this and $Q = V_4 C_4$ into the equation for $f_V$, we have $$f_V = \frac{1}{\epsilon \, C_{xL}} \cdot \frac{V_4 C_4 \, r \, S_V}{V_4 \alpha \, k \, S_H} = \frac{C_4}{C_{xL}} \cdot \frac{r \, S_V}{\epsilon \alpha \, k \, S_H}$$

When the bridge 10 is balanced, $$C_4/C_{xL} = C_3/C_S;$$

hence, $f_V = C_3 \, r \, S_V / (\epsilon \, C_S \, \alpha \, k \, S_H)$, as stated previously.

This equation, and the entire basis for the void fraction calculation, has so far been justified only for a single void. It is easily shown, however, that the effects of a multiplicity of voids are additive. The equation:

$$\epsilon \, C_{xL} \, f_{Vi} = C_{xH} - C_{xL} = dq_i/dV$$

states that for a voltage change, $dV$, on the sample during the discharging part of the cycle (and on the straight portion of the side 18 if the side 18 is curved), the charge transfer in the sample leads, and in $C_4$, due to the $i^{th}$ void is $$dQ = \sum_i dq_i = \epsilon \, C_{xL} \, dV \sum_i f_{Vi} = \epsilon \, C_{xL} \, dV \, f_V$$

so that the total void fraction is $$f_1 = \frac{1}{\epsilon\, C_{xL}} \frac{dQ}{dV} = \frac{1}{\epsilon\, C_{xL}} \frac{Q}{V_D}$$

even when many voids are present. Note that this derivation, depending only on the slope of the high-voltage part of the sides 18 or 20 just before voltage crest, does not require that all voids have the same ionization voltage. In this case $V_D$ is properly defined by the intersection of the parallelogram base 23 and the tangent to the straight part of the side 18, and adjustment of $k$ as described is equivalent to this choice of $V_D$.

The function of an oscillograph, as used herein is to display visually the way in which the time variation of a voltage, connected to the horizontal axis input is related to the time variation of another voltage, connected to the vertical axis input, or alternatively to display the specific variation of either voltage with time. Although the oscillograph is felt to be the most convenient and most informative means for this purpose, other non-oscillographic means for achieving the measurements described herein can also be used. For example, the condition of horizontality of the top and bottom of the parallelogram implies that during the corresponding parts of the applied high voltage cycle, i.e. beginning at the positive or negative peaks of the high voltage and continuing until void ionization begins, the time variation of the vertical-axis voltage is zero; likewise, the verticality of the parallelogram sides during the straight portion, occurring just prior to the peaks of the high voltage, indicates zero time variation of the horizontal-axis voltage during this period. Meter circuits which measure the time variation of a voltage during selected time intervals are readily constructible without the use of an oscillograph, and could in fact be used to make the measurements described herein; such means are meant to be included in the scope of the invention. The oscillograph is the preferred, but not the only, means of making such measurements.

The adjustment for verticality of the parallelogram sides is to be considered as a convenient means, but not the only means, for measuring the slope of the sides of the original parallelogram. This too can be done in other ways, for example by meter circuits which measure during the corresponding time interval the time variation of the vertical voltage as compared to that of the horizontal voltage, i.e. the ratio of the time derivatives. Such other methods of slope measurement are meant to be included in the scope of the invention; the use of an oscillographic display adjusted for vertical sides as described herein is the preferred, but not the only, method for slope measurement. In particular, the condition for vertical sides can also be approximated by adjusting $k$ for minimum peak-to-peak voltage of the signal $S_o+S_2$, although for curved parallelogram sides as frequently found in practice this adjustment is not quite equivalent to verticality of sides and is therefore not preferred.

In the capacitance bridge as conventionally employed, as described in AIEE Paper 60-97 the capacitances $C_3$ and $C_4$ are normally made much larger than $C_s$ or $C_x$ respectively, so that almost the entire high voltage is impressed across $C_s$ and $C_x$. In this case the bridge may be considered as a means whereby the currents produced in $C_s$ and $C_x$ by the applied test voltage are made to flow through selected other impedances $C_3$ and $C_4$ and $R_4$, thereby producing voltages which are compared to each other (in this case by examining their difference $S_2$) thereby demonstrating the behavior of the partial discharges. Other ways of comparing the currents in $C_s$ and $C_x$ are also possible; for instance, these currents can each be allowed to flow into operational amplifier circuits whose outputs can be combined by further differentiating, integrating, multiplying or adding circuits to give a signal essentially equivalent to $S_2$. In such circuits the classical bridge arrangement of four impedances connected cyclically around a square may no longer be evident, although impedances and functions equivalent to these can in general be identified in the circuit. Such generalized bridge circuits are included in the term "bridge" as used herein, in the specification and claims. For example, since $C_s$ and $C_3$ form a capacitance voltage divider, the voltage across $C_3$ is simply a fraction of the applied test voltage and could be replaced by a similar voltage derived in other ways.

Figure 7:
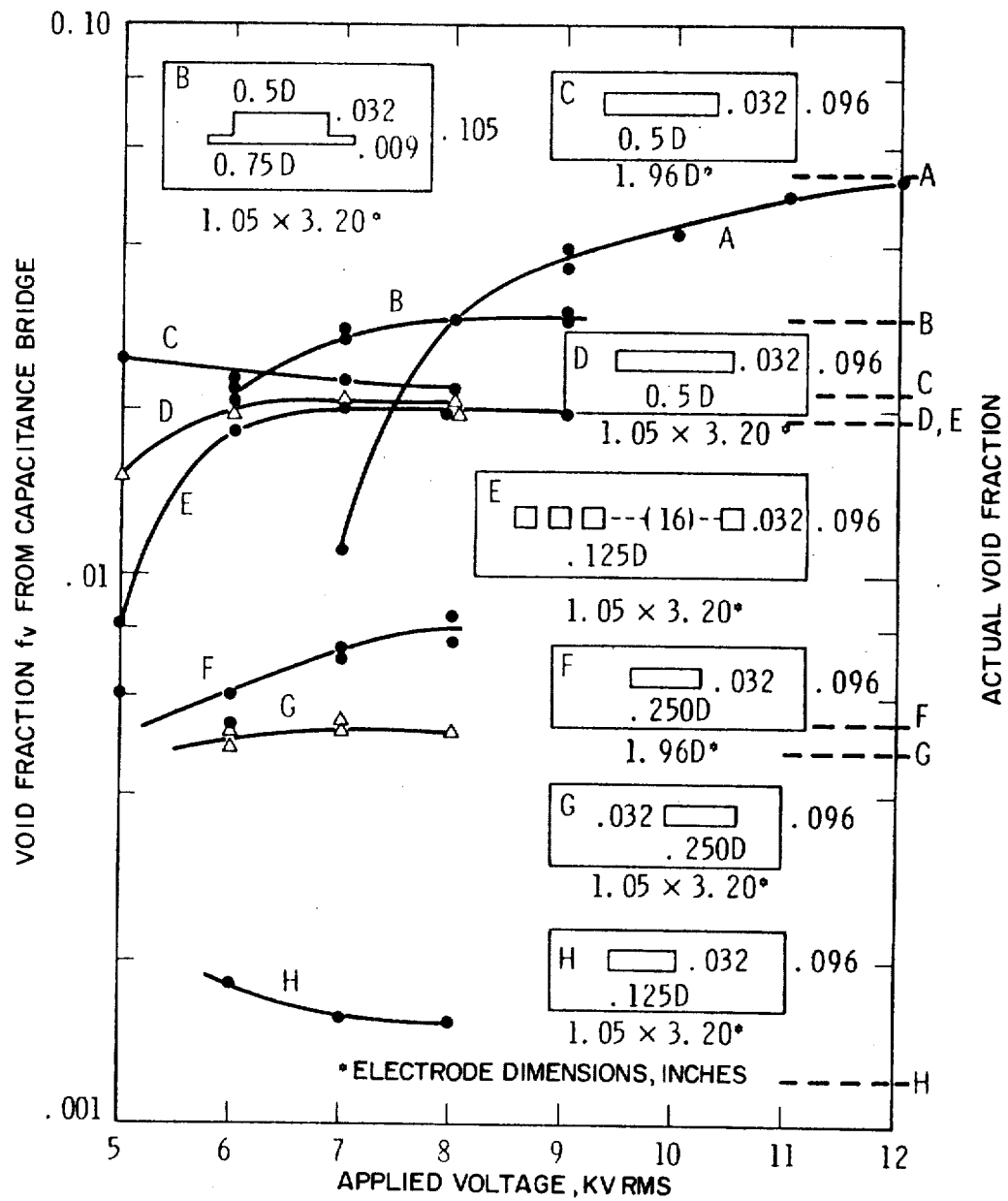

As a further test of the accuracy of the disclosed void estimation technique, a series of voids was made by clamping between electrodes sandwiches of several sheets of polyethylene of which some of the interior sheets had various numbers, sizes, and shapes of holes, so that the capacitance bridge calculation of $f_V$ could be compared to the geometrically calculated value. FIG. 7 shows values of $f_V$ estimated from the disclosed capacitive bridge measurements with different voltages, compared to the actual geometric values. Dimensions of the sample and various voids are also shown except for void A which was a complex combination of several holes. Dimension shown are in inches, and a D following the dimension indicates they are circular. The actual void fractions range from about 0.001 to 0.05. Corona onset voltage for these samples, A through H, was in most cases close to 4 kv. It can be seen that the estimates are rather good, particularly if the voltage is of the order of twice corona onset or more. As in most partial discharge measurements, some variation with time was observed, presumably indicating changing conditions at void surfaces. No definite drift of estimated $f_V$ either toward or away from the correct value was apparent. It was pointed out in AIEE paper 60-97 that void content and total charge estimation can be made from measurements of capacitance on a Schering or transformer ratio arm bridge. Such measurements, using a transformer bridge were also made on the same void samples, and showed generally good comparison results. It is apparent from the above disclosure that the disclosed electrical system provides for simple and accurate estimation of the void content of a solid dielectric. It is felt that estimates of void fractions made possible by the capacitance bridge are more convenient and more accurate than when made on a Schering or transformer ratio arm bridge. When the disclosed parallelogram to rectangle transformation is utilized, simple subsequent calculations requiring no photographs can be employed for determining void fraction, a significant measurement of insulation quality.

I claim:

1. A method for measuring the void content of a solid dielectric comprising steps of:
   connecting a sample of the solid dielectric as a capacitor dielectric in one leg of a capacitance bridge;
   connecting a fraction of the input voltage of the capacitance bridge to the horizontal axis input of an oscillograph;

connecting the output of the capacitance bridge to the vertical axis input of the oscillograph;

applying a relatively low voltage to the input of the capacitance bridge;

balancing the capacitance bridge to provide a horizontal straight line trace on the oscillograph;

applying a relatively high voltage to the input of the capacitance bridge so that most of the voids in the solid dielectric sample are ionized and a parallelogram with a horizontal base is displayed on the oscillograph; and modifying the horizontal axis input of the oscillograph as a function of the vertical input to the oscillograph so that the parallelogram is transformed into a rectangle displayed on the oscillograph;

the amount of modification of the horizontal axis input being proportional to the void fraction.

2. A method for measuring the void content as claimed in claim 1 wherein the void fraction is equal to:

$$f_v = C_3 r S_V/(\epsilon C_s \alpha S_H k)$$

where $f_V$ is the fractional void content of the insulation;

$C_3$ is the capacitance of one leg of the bridge;

$C_S$ is the capacitance of another leg of the capacitance bridge;

$r, S_V, \alpha, S_H$, are predetermined circuit constants;

$\epsilon$ is the dielectric constant of the dielectric under test; and, $k$ is the amount of modification required to form the parallelogram into a rectangle.

3. Apparatus for determining the void content of a solid insulation comprising:

a capacitance bridge comprising four legs, an input and an output;

a sample capacitor forming one leg of said capacitance bridge wherein the sample capacitor dielectric comprises the insulation under examination;

an oscillograph having a first input, controlling one axis, connected to the output of said capacitance bridge and a second input, controlling the other axis, connected to the input of said capacitance bridge; and adjusting means disposed between the first input and the second input of said oscillograph for modifying the signal into one input as a function of the signal into the other input of said oscillograph.

4. Apparatus for determining the insulation void content as claimed in claim 3, comprising:

a first amplifier connected to the output of said capacitance bridge and feeding one of the inputs of said oscillograph;

a second amplifier connected to the input of said capacitance bridge;

adjustment means connected to the output of said first amplifier;

adding circuit means having a first input connected to said adjustment means and a second input connected to the output of said second amplifier and providing an output signal to said oscillograph which is determined by the signals to its first and second input.

5. Apparatus for determining insulation void content as claimed in claim 4 comprising:

transformer means disposed between the output of said capacitance bridge and the input of said first amplifier.

6. A method for determining the capacitance difference of a solid dielectric with a relatively high voltage applied and the solid dielectric with a relatively low voltage applied, which can be used for determining the void content of the solid dielectric comprising the steps of:

connecting the dielectric sample to form the dielectric of a capacitor which is one leg of a capacitance bridge;

connecting the input and the output of the capacitance bridge to an oscillograph;

adjusting the capacitance bridge so that a parallelogram is displayed on the oscillograph wherein the slope of the sides of the parallelogram is proportional to the difference between the high voltage capacitance and the low voltage capacitance of the sample under test; and adjusting the inputs to the oscillograph so that the display parallelogram is transformed into a rectangle and thus amount of adjustment is proportional to the difference of the high voltage capacitance and the low voltage capacitance of the sample under test.

7. Apparatus for determining the void content of a solid dielectric sample comprising:

capacitance bridge means wherein the solid dielectric sample comprises the dielectric of one of the capacitors forming said capacitance bridge:

display means connected to said capacitance bridge means for displaying a parallelogram wherein the slope of one of the sides of the parallelogram is proportional to the difference between the high voltage capacitance of the sample and the low voltage capacitance of the sample; and adjustment means connected to adjust the display means so that the figure displayed on the display means is a rectangle and the amount of adjustment is thus proportional to the difference between the high voltage capacitance of the sample and the low voltage capacitance of the sample.

8. A method for determining the void content of a solid dielectric sample comprising the steps of:

connecting the dielectric sample as a capacitor dielectric in one leg of a capacitance bridge;

balancing the bridge with a relatively low applied voltage;

applying a relatively high voltage, which ionizes most of the voids in the solid dielectric, to the capacitance bridge;

combining a signal proportional to the input to the bridge and a signal proportional to the output of the bridge; and, adjusting the magnitude of the signal proportional to the output of the bridge, which is combined with a signal proportional to the input of the bridge, so that the peak-to-peak magnitude of the combined signal is a minimum.

9. A method for determining the void content of a solid dielectric comprising the steps of:

constructing a test capacitor using the solid dielectric as the capacitor dielectric;

connecting the test capacitor in a bridge circuit;

applying a high alternating current potential to the bridge circuit;

adjusting the bridge to make $dS_2/dt = 0$ just after a peak of $S_1$; and adjusting a combination of $S_1$ and $S_2$ to make $d(S_1 + S_2)/dt = 0$ just before the peak of $S_1$;

the amount of adjustment required to make $d(S_1 + S_2)dt = 0$ being proportional to the void content of the dielectric;

$S_2$ is the output of the bridge circuit; and, $S_1$ is the input to the bridge.

10. Apparatus for determining the void content of a solid dielectric sample comprising:

bridge means adapted to receive the solid dielectric sample as the dielectric of a capacitor disposed therein;

input means for supplying an alternating current potential to the bridge means;

measuring means for measuring the output of the bridge means;

first adjusting means for making $dS_2/dt = 0$ just after peaks of $S_1$;

second adjusting means for making $d(S_1 + S_2)/dt = 0$ just before peaks of $S_1$; wherein, $S_1$ is a signal proportional to the input to said bridge means; and, $S_2$ is a signal proportional to the output of said bridge means.

* * * * *